United States Patent
Choi et al.

(10) Patent No.: US 10,431,530 B2
(45) Date of Patent: Oct. 1, 2019

(54) POWER SEMICONDUCTOR MODULE AND METHOD FOR MANUFACTURING THE SAME

(71) Applicant: Magnachip Semiconductor, Ltd., Cheongju-si (KR)

(72) Inventors: Jae Sik Choi, Cheongju-si (KR); Si Hyeon Go, Cheongju-si (KR); Jun Young Heo, Incheon-si (KR); Moon Taek Sung, Sejong-si (KR); Dong Seong Oh, Incheon-si (KR)

(73) Assignee: MagnaChip Semiconductor, Ltd., Cheongju-si (KR)

( * ) Notice: Subject to any disclaimer, the term of this patent is extended or adjusted under 35 U.S.C. 154(b) by 27 days.

(21) Appl. No.: 15/831,499

(22) Filed: Dec. 5, 2017

(65) Prior Publication Data
US 2018/0102309 A1 Apr. 12, 2018

Related U.S. Application Data

(62) Division of application No. 15/244,846, filed on Aug. 23, 2016, now Pat. No. 9,893,000.

(30) Foreign Application Priority Data

Mar. 30, 2016 (KR) .......................... 10-2016-0038582

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4875* (2013.01); *H01L 23/3735* (2013.01);
(Continued)

(58) Field of Classification Search
CPC ......... H01L 23/49575; H01L 23/49541; H01L 23/49537; H01L 23/49531; H01L 23/3735; H01L 23/49562; H01L 24/48; H01L 25/18; H01L 24/14; H01L 21/4875; H01L 24/85; H01L 2924/00014; H01L 2224/0603; H01L 2224/05554; H01L 2224/05552; H01L 2924/1203; H01L 2924/13055; H01L 2224/48247
See application file for complete search history.

(56) References Cited

U.S. PATENT DOCUMENTS

5,070,602 A * 12/1991 Kaufman ................ H01L 21/50
29/827
5,876,859 A * 3/1999 Saxelby, Jr. ........ H01L 21/4839
257/E23.067
(Continued)

*Primary Examiner* — Hoang-Quan T Ho
(74) *Attorney, Agent, or Firm* — NSIP Law (57) ABSTRACT

A power semiconductor module includes: a substrate including first, second, and third metal patterns separated from each other, a semiconductor element located on the substrate, a lead frame located on the substrate and including first, second, third, and fourth bodies; a first terminal connected to the first body, a second terminal connected to the second body, and a third common terminal that connects the third body and the fourth body, wherein a length of the third common terminal is longer than that of the first and second terminals.

14 Claims, 9 Drawing Sheets

(51) Int. Cl.
*H01L 23/373* (2006.01)
*H01L 23/00* (2006.01)
*H01L 25/18* (2006.01)

(52) U.S. Cl.
CPC .. *H01L 23/49531* (2013.01); *H01L 23/49537* (2013.01); *H01L 23/49541* (2013.01); *H01L 23/49562* (2013.01); *H01L 24/14* (2013.01); *H01L 24/48* (2013.01); *H01L 24/85* (2013.01); *H01L 25/18* (2013.01); H01L 2224/05552 (2013.01); H01L 2224/05554 (2013.01); H01L 2224/0603 (2013.01); H01L 2224/48247 (2013.01); H01L 2924/00014 (2013.01); H01L 2924/1203 (2013.01); H01L 2924/13055 (2013.01)

(56) References Cited

U.S. PATENT DOCUMENTS

| | | | |
|---|---|---|---|
| 5,926,372 A * | 7/1999 | Rinehart | H01L 22/20 361/704 |
| 6,727,585 B2 | 4/2004 | Choi | |
| 2010/0127371 A1* | 5/2010 | Tschirbs | H01L 23/13 257/684 |

* cited by examiner

POWER SEMICONDUCTOR MODULE AND METHOD FOR MANUFACTURING THE SAME

CROSS-REFERENCE TO RELATED APPLICATIONS

This application is a divisional application of U.S. application Ser. No. 15/244,846 filed on Aug. 23, 2016, which claims benefit under 35 USC 119(a) of Korean Patent Application No. 10-2016-0038582 filed on Mar. 30, 2016 in the Korean Intellectual Property Office, the entire disclosure of which is incorporated herein by reference for all purposes.

BACKGROUND

1. Field

The following description relates to a power semiconductor module and a method of manufacturing the power semiconductor module. The following description also relates to a power semiconductor module and a method of manufacturing the power semiconductor module that facilitates coupling of a Direct Bonded Copper (DBC) substrate to which a semiconductor chip is attached and a lead frame including a plurality of terminals.

2. Description of Related Art

A power semiconductor device is used for power conversion, such as conversion from AC to DC, power voltage transformation, such as a step-up transformation or a step-down transformation, power stabilization, power management, and power control in order to use electric energy.

For example, the power semiconductor is used for a power supply, an Uninterruptible Power Supply (UPS), a welding device, and an electric vehicle requiring high power. Examples of a representative power semiconductor may include an Insulated Gate Bipolar Transistor (IGBT), a Metal-Oxide Semiconductor Field Effect Transistor (MOSFET), a super junction, and a diode.

A power semiconductor module is a module in which an integrated circuit (IC) and a companion element, such as an IGBT or a Fast Recovery Diode (FRD) are integrated into one package, unlike an approach where these elements are each presented as a discrete single element. For example, a power semiconductor module is a high efficiency power element that combines and uses an IGBT, which is a high power semiconductor element, and an FRD element that assists turn on/off conversion, into one piece. Accordingly, a power semiconductor module that uses in parallel multiple such power semiconductor elements at once to generate high power may be produced and provided.

A conventional method of packaging a power semiconductor module includes a process of coupling a plurality of terminals attached to a lead frame to a DBC substrate. For example, in such a process of simultaneously bonding a plurality of terminals in a desired area of one DBC substrate, a pressure is applied to the lead frame. In this example, when a pressure is not evenly applied to the lead frame, a problem may occur that any one terminal is floated or is otherwise not well attached. In such a fault state, a subsequent process, for example, soldering, wire bonding, molding, trimming, marking, and a final test are performed. However, only in the final test is the problem discovered. Accordingly, in the subsequent processing, much unnecessary cost occurs because additional steps are performed even though there is a fault state.

The examples have been made in view of the above issues and provide a power semiconductor module that can minimize a coupling fault of a terminal and a substrate by reducing the number of terminals.

The examples further provide a method of manufacturing power semiconductor module that is able to discover a fault earlier by previously checking a coupling fault of a terminal in order to save in cost.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a power semiconductor module includes a substrate including first, second, and third metal patterns separated from each other, a semiconductor element located on the substrate, a lead frame located on the substrate and including first, second, third, and fourth bodies, a first terminal connected to the first body, a second terminal connected to the second body, and a third common terminal that connects the third body and the fourth body, wherein a length of the third common terminal is longer than that of the first and second terminals.

The first terminal may be connected to the first metal pattern, the second terminal may be connected to the second metal pattern, and the third common terminal may be connected to the third metal pattern.

The third metal pattern may be divided into a solder area and a non-solder area, the third common terminal may be located on the solder area, and the semiconductor element may be wire bonded to the non-solder area.

The first terminal may be electrically connected to a drain electrode of the semiconductor element, the second terminal may be electrically connected to a gate electrode of the semiconductor element, and the third common terminal may be electrically connected to a source electrode of the semiconductor element.

The third metal pattern may include a first area and a second area, wire bonding may be performed on the first area, and the third common terminal may be located on the second area.

The first area may have a same width as a width of the second metal pattern.

The first area and the second area may have a same width.

The semiconductor element may include Insulated Gate Bipolar Transistor (IGBT) and Fast Recovery Diode (FRD) elements.

The substrate may be formed with a first conductive layer, a second insulating layer, and a third conductive layer, the first and third conductive layers may be electrically separated from each other, and the third conductive layer may include the first, second, and third metal patterns.

The second terminal may have a length smaller than a length of the first terminal.

The substrate may be formed on a base plate.

The substrate may be a Direct Bonded Copper (DBC) substrate.

The third common terminal may have a non-inclined form.

In another general aspect, a method of manufacturing a power semiconductor module includes preparing a Direct Bonded Copper (DBC) substrate including a metal pattern, forming a power semiconductor module by wire bonding a metal pattern of the DBC substrate and an electrode of a power semiconductor element, testing whether the power semiconductor module is a defective product, coupling the DBC substrate to a base plate, and coupling the DBC substrate and the lead frame.

The method may further include performing soldering, molding, trimming, marking, and a final test after the coupling of the DBC substrate and the lead frame.

The metal pattern may include first, second, and third metal patterns separated from each other, wherein the lead frame includes first, second, third, and fourth bodies and further includes a first terminal connected to the first body, a second terminal connected to the second body, and a third common terminal that connects the third body and the fourth body, wherein a length of the third common terminal is longer than that of the first and second terminals.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

Disclosed technology may have the following effects. However, it is not required that a specific example are required to include the entire set of following effects or are required to include only the following effects, and it is not to be understood that the scope of disclosed technology is limited thereto.

In a power semiconductor module according to an example, by implementing a lead frame by reducing the number of terminals, in a module production process, fault coupling is minimized.

In a method of manufacturing a power semiconductor module according to an example, after wire bonding of a semiconductor element, by performing an earlier test, a defective product is discovered earlier, and thus a time and cost for a module production process is able to be prevented from being wasted.

FIGS. 1A-1D are diagrams illustrating a power semiconductor module according to an example.

Figure 1A:
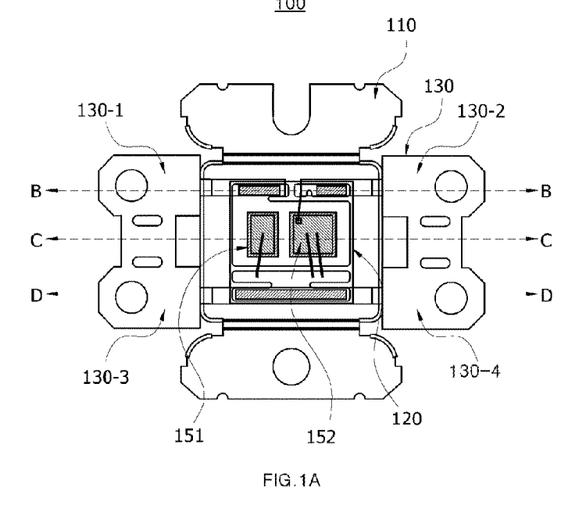
FIGS. 1A-1D are diagrams illustrating a power semiconductor module according to an example.

FIG. 1A illustrates a power semiconductor module 100. The power semiconductor module 100 includes a base plate 110, a substrate 120, a lead frame 130, and a plurality of semiconductor elements 151, 152. The substrate 120 is formed on the base plate 110. The lead frame 130 and the plurality of semiconductor elements 151, 152 are formed on the substrate 120. In this example, one lead frame 130 is formed with four body areas 130-1, 130-2, 130-3, and 130-4 and a plurality of terminals 131,132, and 133. The substrate 120 is divided into three metal pattern areas 121, 122, and 123, which is to be described in further detail later in FIG. 2B. The plurality of semiconductor elements 151, 152 and the substrate 120 are electrically connected together by wire bonding. Further, the lead frame 130 and the plurality of semiconductor elements 151, 152 are electrically connected together.

Figure 1B:
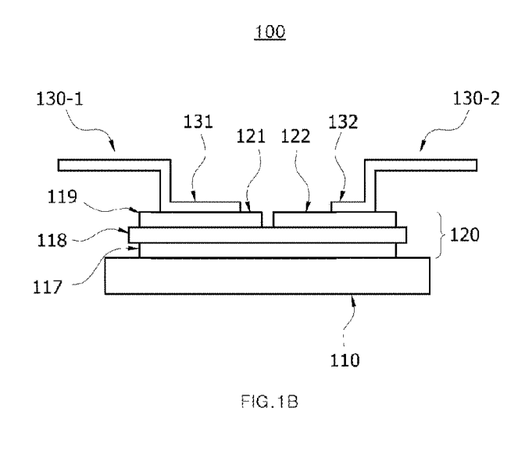
Figure 1C:
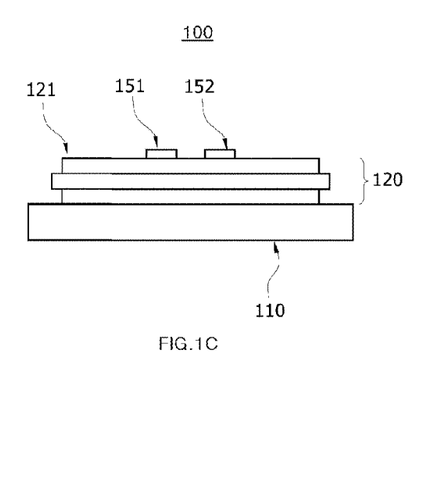
Figure 1D:
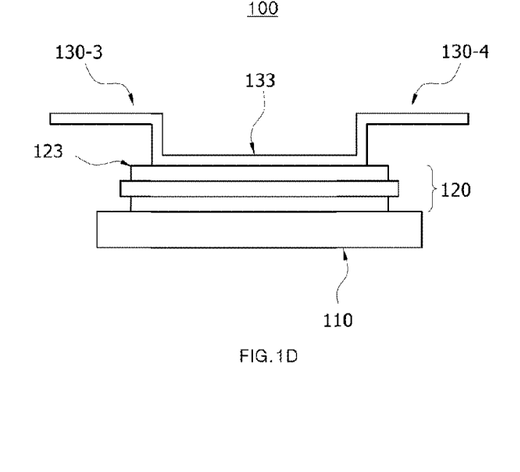

FIGS. 1B, 1C, and 1D are cross-sectional views illustrating a power semiconductor module as shown in the example of FIG. 1A, taken along lines B-B, C-C, and D-D, respectively, of the example of FIG. 1A. Referring to the example of FIG. 1B, the substrate 120 is formed on the base plate 110. The substrate 120 is a Direct Bonded Copper (DBC) substrate. As shown in the example of FIG. 1B, the DBC substrate 120 is formed to have a first conductive layer 117, a second insulating layer 118, and a third conductive layer 119. For example, the first and third conductive layers 117 and 119 are electrically separated by the second insulating layer 118. In such an example, the first and third conductive layers 117 and 119 are made of copper. The third conductive layer 119 includes a plurality of metal patterns 121,122, and 123. The plurality of metal patterns 121, 122, and 123 are electrically separated from one another. In the example of FIG. 1B, the first terminal 131 connected to the first body 130-1 of the lead frame 130 is formed on the first metal pattern 121. Further, the second terminal 132 connected to the second body 130-2 of the lead frame 130 is formed on the second metal pattern 122. Because a solder layer of a metal material is formed between each terminal and the metal pattern, each terminal and the metal pattern are electrically connected.

In the example of FIG. 1C, the substrate 120 is formed on the base plate 110. In the substrate 120, the first metal pattern 121 is provided, and a plurality of semiconductor elements 151, 152 are independently provided on the first metal pattern 121. In an example, the semiconductor elements 151, 152 may be implemented as being a high speed reverse recovery diode (FRD), a MOSFET, a transistor (TR), a diode, a control IC, or an insulating gate positive polarity transistor (IGBT). That is, the power semiconductor elements 151, 152 may be implemented in various forms and accordingly determine a characteristic of the power semiconductor module 100. For example, the power semiconductor element is formed such that there is more than one power semiconductor element. In an example, the FRD element 151 and the IGBT element 152 are displayed, but a control IC may be added in other examples. The control IC controls the IGBT element 152. In this example, the plurality of power semiconductor elements 151, 152 and the lead frame 130 use the same plane. That is, the plurality of power semiconductor elements 151, 152 and the lead frame 130 are separately formed on the same plane of a metal pattern of the DBC substrate 120.

In the example of FIG. 1D, the DBC substrate 120 is formed on the base plate 110. The third common terminal 133 connected to the third body 130-3 and the fourth body 130-4 of the lead frame 130 is formed on the third metal pattern 123. Finally, each metal pattern is connected on a one-to-one basis to a plurality of terminals of the lead frame 130.

In FIGS. 2A-2E, the base plate 110, the DBC substrate 120, and the lead frame 130 having a plurality of terminals, constituting the power semiconductor module 100 are each described further.

Figure 2A:
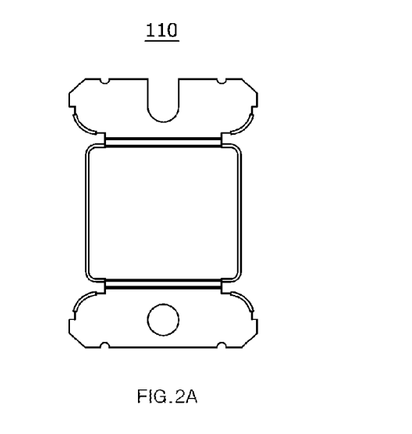
FIGS. 2A-2E are diagrams illustrating elements constituting a power semiconductor module according to an example.

FIG. 2A illustrates the base plate 110. The base plate 110 forms a base of the power semiconductor module 100 and performs a heat releasing function. Also, the base plate 110 may include mounting solder at an upper end portion of the base plate 110 and houses the DBC substrate 120.

Figure 2B:
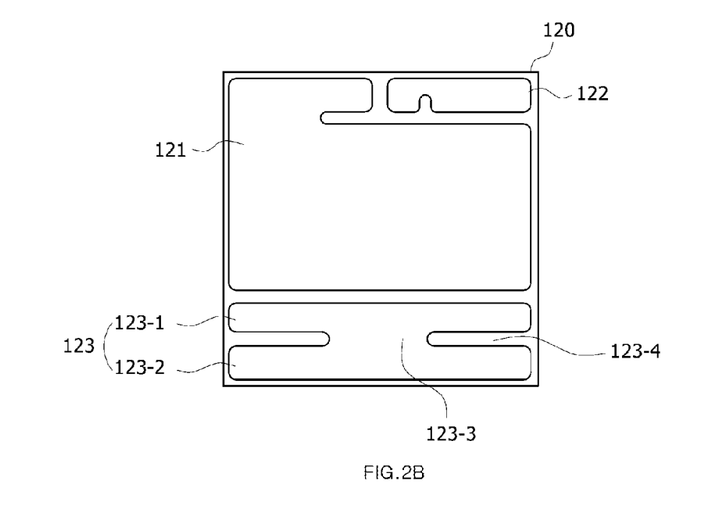

FIG. 2B illustrates the DBC substrate 120. The DBC substrate 120 is a Direct Bonded Copper substrate. The DBC substrate 120 is formed to include a first conductive layer 117, a second insulating layer 118, and a third conductive layer 119, the first and third conductive layers 117 and 119 are electrically separated, and the third conductive layer 119 may include first, second, and third metal patterns 121, 122, and 123.

Figure 2C:
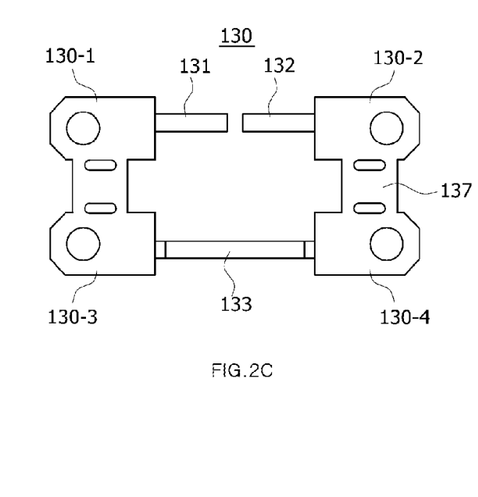
Figure 2D:
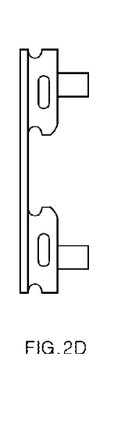
Figure 2E:
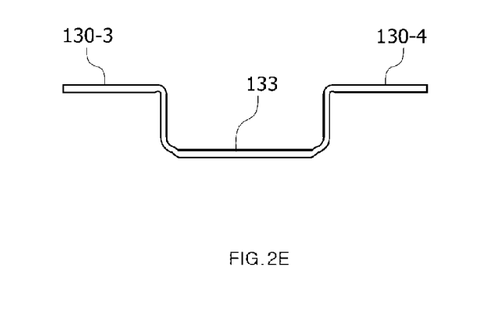

FIGS. 2C, 2D, and 2E each illustrate one lead frame 130. As shown in the example of FIG. 2C, the lead frame 130 includes a first body 130-1, a second body 130-2, a third body 130-3, and a fourth body 130-4. In the present example, one lead frame 130 is used. In alternative technologies, two separate lead frames are used. However, in the present example, because a third common terminal is used, one connected lead frame exists. By a subsequent trimming process, the lead frame 130 is then divided into four bodies.

The lead frame 130 further includes a first terminal 131 connected to the first body 130-1, a second terminal 132 connected to the second body 130-2, and a third common terminal 133 connected to the third body 130-3 and the fourth body 130-4. In an example, a length of the second terminal 132 is smaller than that of the first terminal 131. In such an example, the first terminal 131 is connected to a drain electrode of the semiconductor element, and in a drain area, due to the presence of a large current amount, the first terminal 131 is formed longer than the second terminal 132. Also, in an example, a length of the third common terminal 133 is longer than that of the first and second terminals 131 and 132. This greater length is used because the third common terminal 133 is integrated to reduce the number of terminals.

In an example, the lead frame 130 further includes trimming areas 137 formed between the first body 130-1 and the third body 130-3 and between the second body 130-2 and the fourth body 130-4. When an assembly package 310 of the power semiconductor module 100 is complete, the trimming areas 137 may be removed by trimming. That is, until the trimming areas 137 are removed, the first body 130-1 and the third body 130-3, and the second body 130-2 and the fourth body 130-4 are connected.

FIG. 2D is a cross-sectional view of a lead frame 130 viewed from a side surface of the example of FIG. 2C. FIG. 2E is a cross-sectional view of a lead frame 130 that principally views a third body 130-3 and a fourth body 130-4 of the lead frame 130. In the first body 130-1 and the second body 130-2, each terminal is separately formed, but the third body 130-3 and the fourth body 130-4 are connected by one common terminal 133.

Figure 3A:
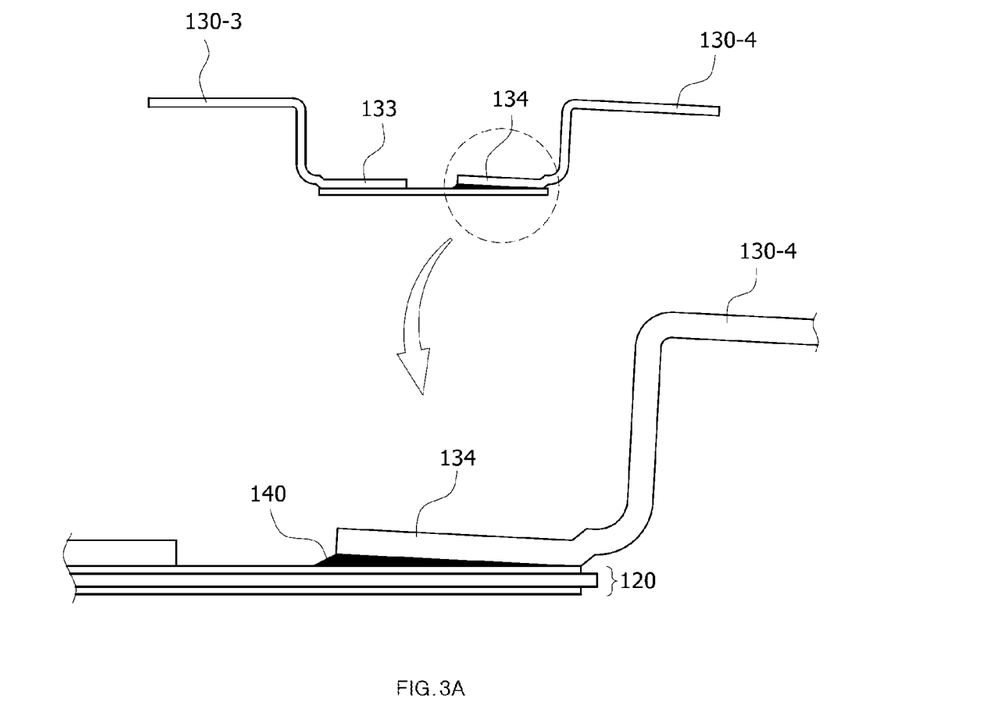
FIGS. 3A-3B are diagrams illustrating a method of bonding a terminal of a lead frame and a DBC substrate, which is one operation performed during power semiconductor module production processes.
Figure 3B:
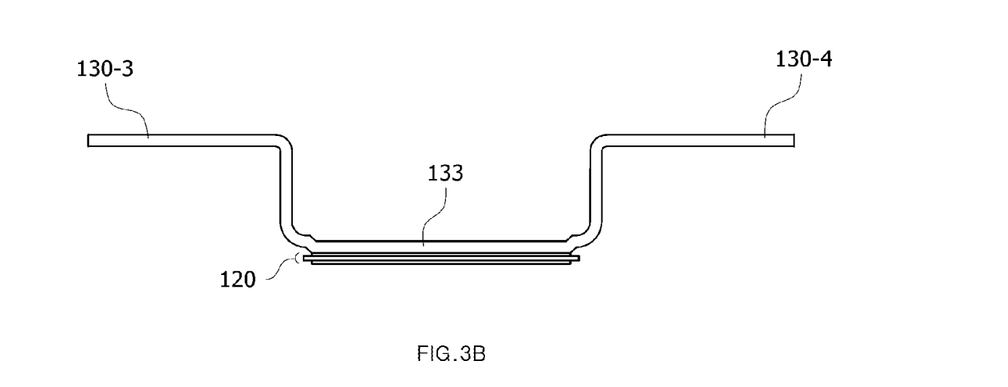

FIGS. 3A-3B illustrate an effect of a power semiconductor module produced according to an example. A power semiconductor module production process includes a bonding process of the lead frame 130 and the DBC substrate 120.

FIG. 3A illustrates an example of a bonding process of a lead frame and a DBC substrate in an alternative technology. The alternative lead frame has two lead frames, and each lead frame is formed with two bodies and two terminals. Accordingly, in the alternative lead frame, a total of four bodies exist, and the lead frame includes four terminals connected to each body. In further detail, the lead frame 130 includes third and fourth terminals 133 and 134 connected to third and fourth bodies 130-3 and 130-4, respectively. Accordingly, the bonding of the third and fourth terminals 133 and 134 is affected by a shape of solder layers 141-145 existing under each terminal. It is accordingly assumed that the solder layer under the third terminal 133 is coated with a normal thickness and that a solder layer 140 under the fourth terminal 134 is formed with a relatively large thickness. In a case of the fourth terminal 134, because the solder layer 140 under the fourth terminal 134 has a large thickness, the fourth terminal 134 is bonded with an inclined form. Accordingly, when fixing a body for a subsequent process, a problem may occur. For example, because any one side of body is inclined, a problem may occur. Furthermore, when the fourth terminal 134 has such an inclined form, a problem may occur upon wire bonding. When wire bonding is not appropriately performed, a problem may occur in a connection to the semiconductor element.

FIG. 3B is a diagram illustrating a bonding example of a lead frame and a DBC substrate according to an example. As described with reference to the example of FIG. 1D, third and fourth bodies 130-3 and 130-4 are connected together by the common terminal 133. Accordingly, the number of these terminals is reduced from two to one. Because these two terminals are changed to one third common terminal 133, even if a difference occurs in a thickness of a solder layer, the foregoing problems discussed with respect to the alternative technology does not occur, as shown with respect to the example of FIG. 3A. Even if a difference occurs in a thickness of the solder layer, one terminal is used and thus a problem does not occur. Because only one terminal is used, the terminal is not inclined.

FIGS. 4A-4D and 5A-5D are diagrams illustrating a DBC substrate constituting a power semiconductor module without a base plate according to an example. Further, FIGS. 4A-4D and 5A-5D are diagrams illustrating a coupling state of a semiconductor chip or die and a lead frame formed on the DBC substrate. By contrast, a method of producing a power semiconductor module including base plate will be described in FIGS. 6A-6E, 7A-D, and 8A-8E.

Figure 4A:
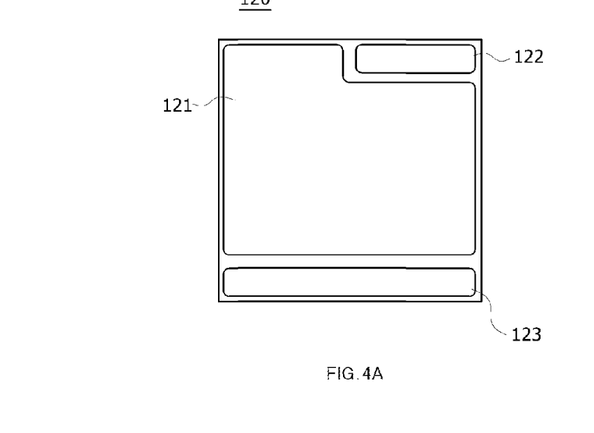
FIGS. 4A-4D and 5A-5D are diagrams illustrating a coupling state of a semiconductor chip and a lead frame formed on a DBC substrate in a power semiconductor module according to an example.

FIG. 4A illustrates the DBC substrate 120. The DBC substrate 120 may include a first metal pattern 121, a second metal pattern 122, and a third metal pattern 123 separated from each other. Each metal pattern is electrically separated from the other metal patterns.

Figure 4B:
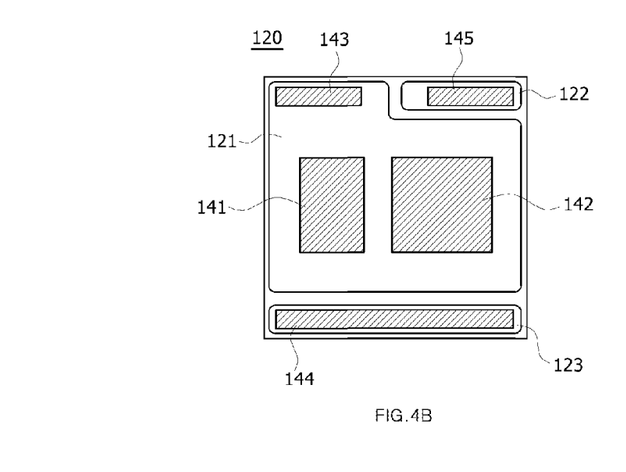

FIG. 4B illustrates a shape in which solder layers 141-145 are formed in the DBC substrate 120. The metal solder layers 141-145 are formed of a material place to attach well a plurality of semiconductor elements and a plurality of terminals of the lead frame 130 to the DBC substrate 120. For example, each of the solder layers 141-145 is formed at a desired location by using a solder coating process. For example, the solder layers 141-145 are formed at an upper end portion of the separated first, second, and third areas 121, 122, and 123 on the substrate 120. Additionally, the solder layers 141-145 may have a sufficient area that is able to accommodate the first terminal 131, the second terminal 132, the third common terminal 133, and the semiconductor elements 151, 152. For example, the solder layers 141-145 may be implemented through a solder perform process or a solder paste process.

Figure 4C:
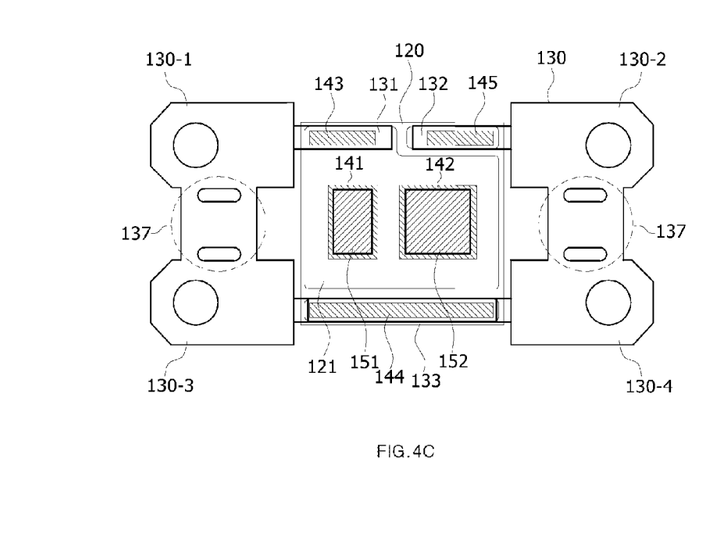

FIG. 4C illustrates a shape in which a plurality of terminals 131-133 of the lead frame 130 and a plurality of power semiconductor elements 151, 152 each are coupled to the DBC substrate 120 using the foregoing solder material.

Figure 4D:
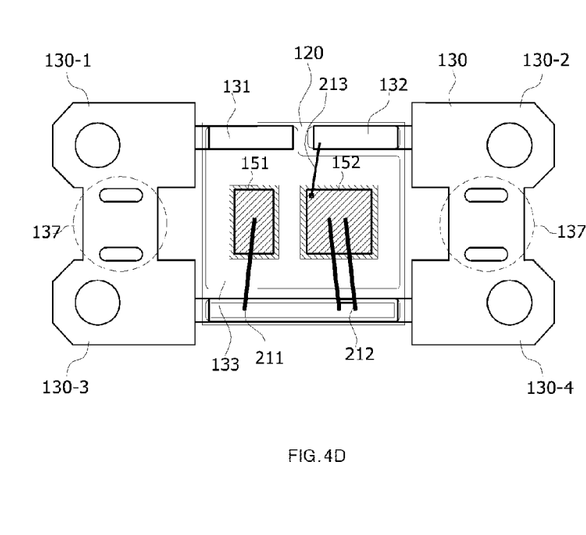

FIG. 4D illustrates a shape in which wire bondings 211-213 are performed in order to electrically connect the power semiconductor element and a terminal of the lead frame. In an example, the first terminal 131 is electrically connected to a drain electrode of the second semiconductor element 152. The second terminal 132 is electrically connected to a gate electrode of the second semiconductor element 152 through the wire bonding 213. The third common terminal 133 may be electrically connected to a source electrode of the second semiconductor element 152 through the wire bonding 212.

In the example of FIG. 4D, in the drain electrode of the second semiconductor element 152, because a rear surface of the second semiconductor element 152 directly contacts with a surface of the DBC substrate 120, wire bonding is not needed. Furthermore, the third common terminal 133 is electrically connected to the source electrode of the first semiconductor element 151 through the wire bonding 211. Accordingly, a source area of the first semiconductor element 151 and a source area of the second semiconductor element 152 are electrically connected by the third common terminal 133.

In this example, the first semiconductor element 151 may be a fast recovery diode (FRD), and the second semiconductor element 152 may be an IGBT, Trench MOSFET, GTO, IGCT or Planar MOSFET. However, these are only examples and other appropriate alternative elements are used in other examples. Fast diodes are companion devices to switches in DC to AC conversion. Every switch, such as a GTO, IGCT or IGBT, requires a complementary diode, for example for "free-wheeling" reactive power, in order to enable operation of the DC-AC conversion system with inductive loads. Such fast diodes are optimized to accept high dynamic stress, such as a fast transition from conducting to blocking state. For every switch family, such as GTO, IGCT and IGBT, it requires fast recovery diodes that are optimized for the switch application.

FIGS. 5A-5D are diagrams illustrating a coupling process between a DBC substrate, a semiconductor element, and a lead frame constituting a power semiconductor module according to another example. FIGS. 5A-5D are different from FIGS. 4A-4D in a DBC substrate. Particularly, a third metal pattern shape is different from the metal pattern shape of FIG. 4A.

Figure 5A:
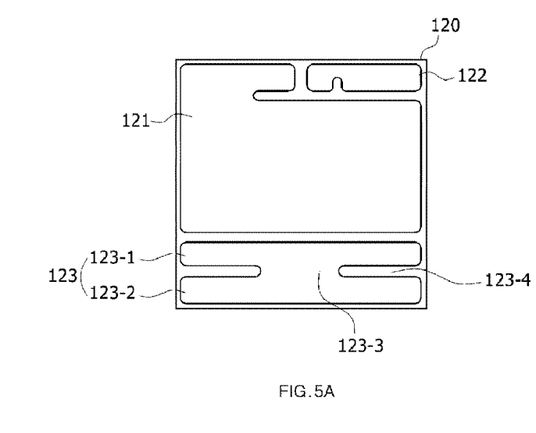
Figure 5B:
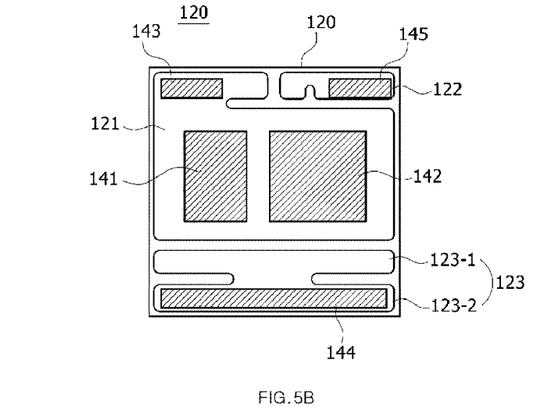

As can be seen in FIGS. 5A and 5B, the third metal pattern 123 is divided into a first area 123-1 and a second area 123-2. Here, the first area 123-1 is a wire bonding area or a non-solder area. The non-solder area is an area in which a solder material is not coated or provided. For example, the second area 123-2 is a terminal mounting area or a solder area of the lead frame 130. That is, in the second area 123-2, a solder material is coated, and the second area 123-2 is an area that puts a terminal of the lead frame 130 on the solder material to form an area of electrical connection. In such an example, the first area 123-1 and the second metal pattern 122 may have the same width. In another example, the first area 123-1 and the second area 123-2 may have the same width. This choice of having the same width is for convenience of a module production process.

In an example, the first area 123-1 and the second area 123-2 are formed in parallel and are connected through first and second area connection portions 123-3. That is, the first area 123-1 and the second area 123-2 are connected to each other through the connection portion 123-3. Also, the first area 123-1 and the second area 123-2 are spaced apart by a separation area 123-4.

Figure 5C:
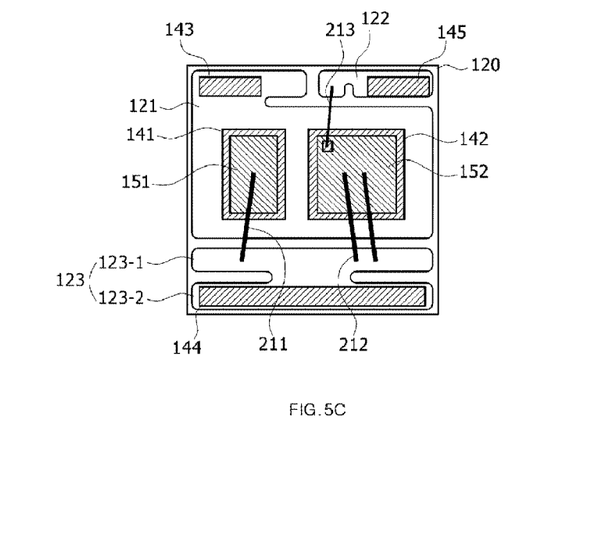

In the example of FIG. 5C, immediately after a plurality of semiconductor elements 151, 152 are coupled to the DBC substrate 120, wire bondings 211-213 are performed. This approach is different from the foregoing example. More specifically, in the example of FIG. 5C, the semiconductor elements 151, 152 are mounted on solder layers 141, 142, and wire bonding is performed. In such an example, the wire bonding is used to connect between the semiconductor elements 151, 152 and metal patterns 122, 123 of the DBC substrate 120. However, in the examples of FIGS. 4A-4D, the wire bonding is used to connect between the semiconductor elements 151, 152 and the terminal of the lead frame 130, and not between metal patterns of the DBC substrate 120.

In an example, the first metal pattern 121 is electrically connected to a drain electrode of the second semiconductor element 152. Additionally, the second metal pattern 122 is electrically connected to a gate electrode of the second semiconductor element 152 through the wire bonding 213. Also, in an example, the third metal pattern 123 is electrically connected to a source electrode of the second semiconductor element 152 through the wire bonding 212. For example, at a drain electrode of the second semiconductor element 152, because a rear surface of the second semiconductor element 152 is in direct contact with a surface of the DBC substrate 120, wire bonding is not needed. At an upper surface of the second semiconductor element 152, a source electrode and a gate electrode are located, and at a lower surface of the second semiconductor element 152, a drain electrode is located and accordingly a connection is performed with the above method. Furthermore, the third metal pattern 123 is electrically connected to a source electrode of the first semiconductor element 151 through the wire bonding 211. For example, the first semiconductor element 151 may be a fast recovery diode (FRD), and the second semiconductor element 152 may be an IGBT, a trench MOSFET, or a planar MOSFET.

Figure 5D:
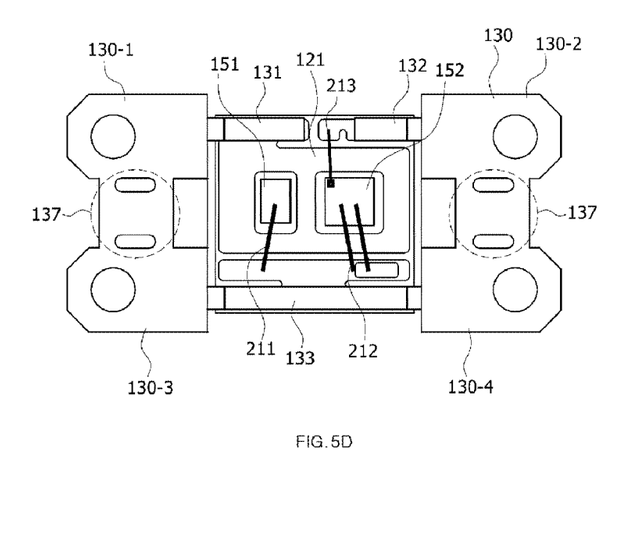

In the example of FIG. 5D, if the power semiconductor module 100 passes the electrical test, the lead frame 130 is coupled to the DBC substrate 120. Accordingly, the power semiconductor module 100 is complete. In such an example, the first terminal 131 of the lead frame 130 is formed on the first metal pattern 121. Furthermore, the second terminal 132 is formed on the second metal pattern 122. Additionally, the third common terminal 133 is formed on the third metal pattern 123. More specifically, the third common terminal 133 is formed on a solder area 123-2 of the third metal pattern 123. Each terminal and the metal pattern are electrically connected together through a metal solder layer. Accordingly, the first metal pattern 121 is connected to the first terminal 131 and a drain electrode of the second semiconductor element 152. Finally, the first terminal 131 and the drain electrode of the second semiconductor element 152 are electrically connected together. Similarly, the second metal pattern 122 is connected to both the second terminal 132 and also to a gate electrode of the second semiconductor element 152. Finally, the second terminal 132 and the gate electrode of the second semiconductor element 152 are electrically connected to each other. Similarly, the third metal pattern 123 is connected to the third common terminal 133 and a source electrode of the second semiconductor element 152. Finally, the third common terminal 133 and a source electrode of the second semiconductor element 152 are electrically connected to each other. Furthermore, the third common terminal 133 is electrically connected to a source electrode of the first semiconductor element 151.

FIGS. 6A-6E are diagrams illustrating a method of manufacturing a power semiconductor module including a base plate according to an example. The process, as shown in FIGS. 6A-6E, is similar to FIGS. 4A-4D.

Figure 6A:
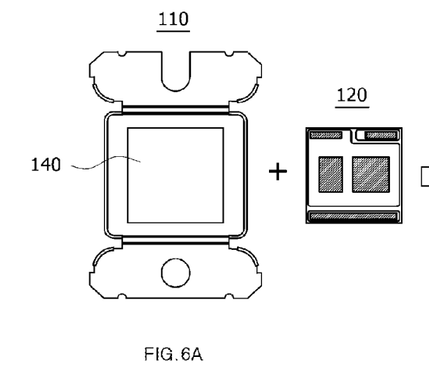
FIGS. 6A-6E, 7A-7D, and 8A-8E are diagrams illustrating a method of manufacturing a power semiconductor module according to an example.
Figure 6B:
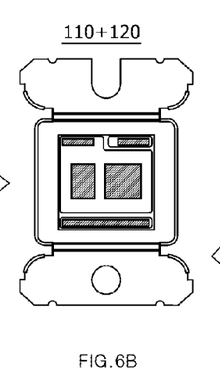

In the example of FIG. 6A, at an upper end portion of the base plate 110, solder layers 141-145 are formed, and in the example of FIG. 6B, the DBC substrate 120 is attached to the base plate 110 using the solder layers 141-145.

Figure 6C:
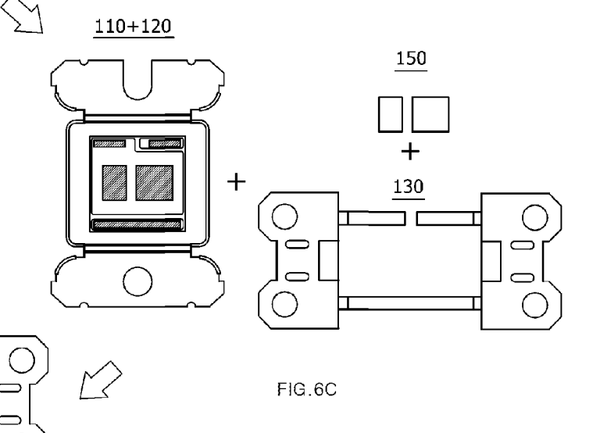
Figure 6D:
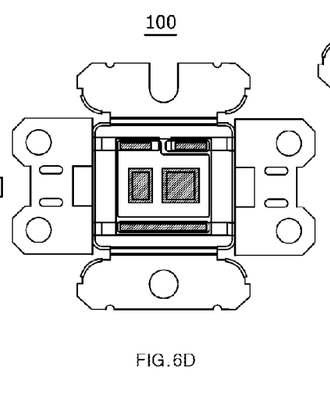

In the example of FIG. 6C, a plurality of semiconductor chips, or a semiconductor die or a semiconductor element 151, 152 and the lead frame 130 are each prepared. In the example of FIG. 6D, the semiconductor elements 151, 152 and the lead frame 130 are mounted or coupled on the DBC substrate 120. In order to attach well the power semiconductor element and the lead frame 130 to the DBC substrate 120, a high temperature process is added. For example, solder materials are coupled to each other through a process of being reflowed in a high temperature. Solder materials discharged to the outside are removed by a cleaning process.

Figure 6E:
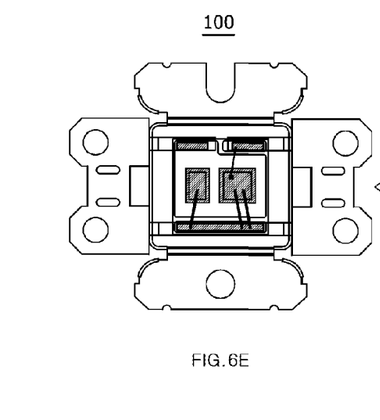

In the example of FIG. 6E, in order to electrically connect the semiconductor elements 151, 152 and the lead frame 130, a wire bonding is performed. After the wire bonding is performed, a molding process, a trimming process, a marking process, and a final test process are performed. At a final step, it is tested whether a semiconductor element is good or not, in terms of whether the semiconductor operates properly. This testing is performed because after wire bonding is performed, a test of the semiconductor element may be performed.

FIGS. 7A-7D are diagrams illustrating a method of manufacturing a power semiconductor module according to another example. The process as shown in FIGS. 7A-7D is based on FIGS. 5A-5D.

Figure 7A:
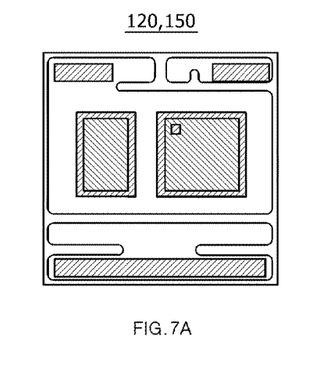

In the example of FIG. 7A, in the DBC substrate 120, a solder layer is formed and a plurality of semiconductor elements 150 is attached to the solder layer. After this step, in order to attach well a plurality of semiconductor elements 150 to the DBC substrate 120, a soldering process and a cleaning process may optionally be added.

Figure 7B:
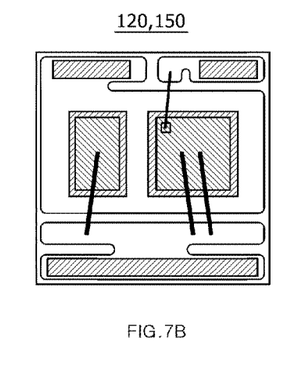

In the example of FIG. 7B, in order to attach the semiconductor elements 151, 152 to a metal pattern of the DBC substrate 120, a wire bonding is performed. Because a wire bonding was formed, at this step, in an example, it is tested whether the semiconductor element is a good semiconductor element that operates properly. Accordingly, in a state in which the lead frame 130 is not disposed, it may be tested whether the semiconductor elements 151, 152 are good. Thus, it is possible to determine whether the power semiconductor module 100 is a defective product based on whether the semiconductor elements 151, 152 operate normally. Therefore, it is possibly determined early whether the power semiconductor module 100 is a defective product. When it is determined early that the power semiconductor module 100 is a defective product, a not-performed process of steps later in the process are omitted and a corresponding process is terminated. Thus a process cost and time may be reduced.

Figure 7C:
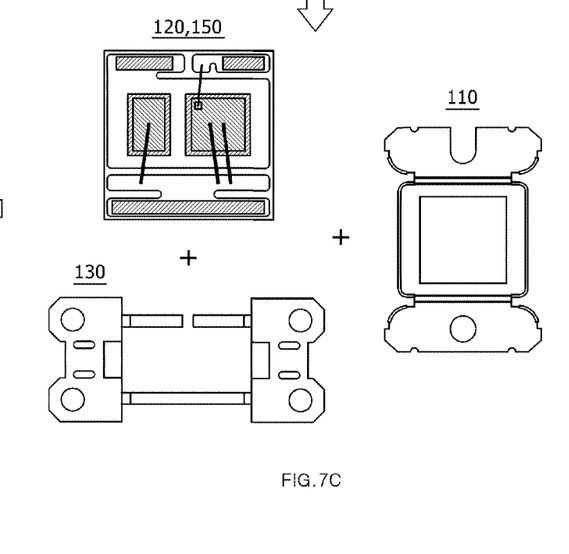
Figure 7D:
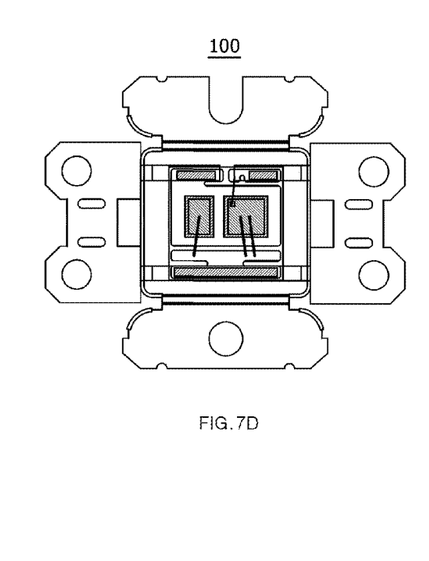

In the example of FIG. 7C, the base plate 110 and the lead frame 130 are prepared. In the example of FIG. 7D, the DBC substrate 120 is mounted at an upper end portion of the base plate 110, and the lead frame 130 is mounted at an upper end portion of the DBC substrate 120. After a mounting process is complete, a soldering process, a molding process, a trimming/forming process, a marking process, a final test process, and a packing process may be added. In this example, the soldering process is to perform soldering at a high temperature to perform bonding well between the lead frame, a plurality of semiconductor elements, and the DBC substrate. Also, in this example, the molding process is a plastic packaging process and is performed to protect a semiconductor element from an external environment. A trimming process separates a plurality of bodies. Accordingly, a trimming area 137 is removed by trimming. Also, a forming process bends a body of the lead frame 130 by 180°.

FIGS. 8A-8E are diagrams illustrating a sequence of processes of producing a power semiconductor module according to another example. The process as shown in FIGS. 8A-8E is based on FIGS. 5A-5D.

Figure 8A:
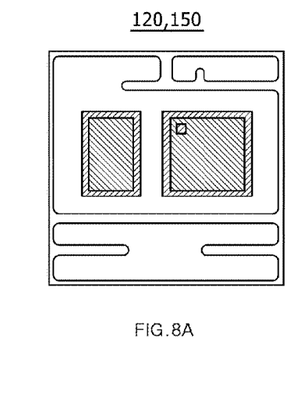

In the example of FIG. 8A, on the DBC substrate 120, the semiconductor element 150 is situated. After this step, in order to attach well a plurality of semiconductor elements to the DBC substrate 120, a soldering process and a cleaning process may be added.

Figure 8B:
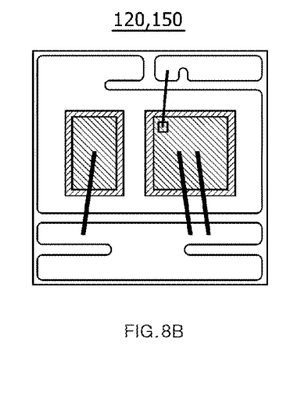

In the example of FIG. 8B, the semiconductor element 150 and a metal pattern of the DBC substrate 120 are electrically connected to each other by wire bonding. In order to determine whether the semiconductor element 150 is good, an intermediate test is performed at this point in time. As described above, by performing such an early test, a production cost and time are reduced because the early test allows early elimination of semiconductor elements that are not good.

Figure 8C:
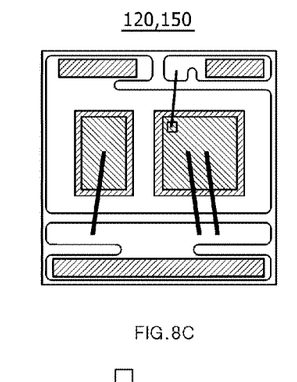
Figure 8D:
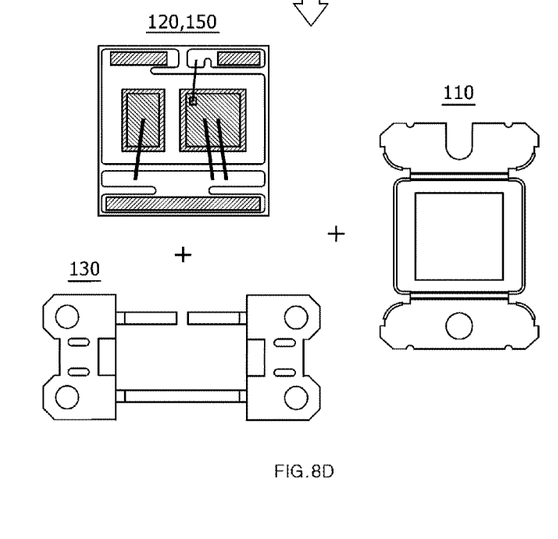
Figure 8E:
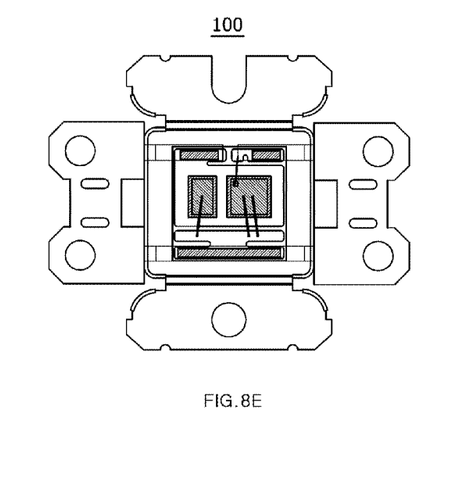

Referring again to the example of FIG. 8C, in an area to attach a terminal of the lead frame 130, solder is coated. In the example of FIG. 8D, the lead frame 130 and a base plate 110 are prepared and provided. In the example of FIG. 8E, the DBC substrate 120 is mounted at an upper end portion of the base plate 110, and the lead frame 130 is mounted at an upper end portion of the DBC substrate 120. After a mounting process is complete, a soldering process, a molding process, a trimming/forming process, a marking process, a final test process, and a packing process may be added.

In FIGS. 7A-7D and 8A-8E, a formation sequence of a solder layer for attaching a terminal of the lead frame differs but the remaining processes are similar to those of a module production process. In a case of FIGS. 8A-8E, two separate solder coating processes, shown in the examples of FIGS. 8A and 8C are used. On the other hand, in an example of FIGS. 7A-7D, only one solder coating process, shown in the example of FIG. 7A, is required.

Figure 9A:
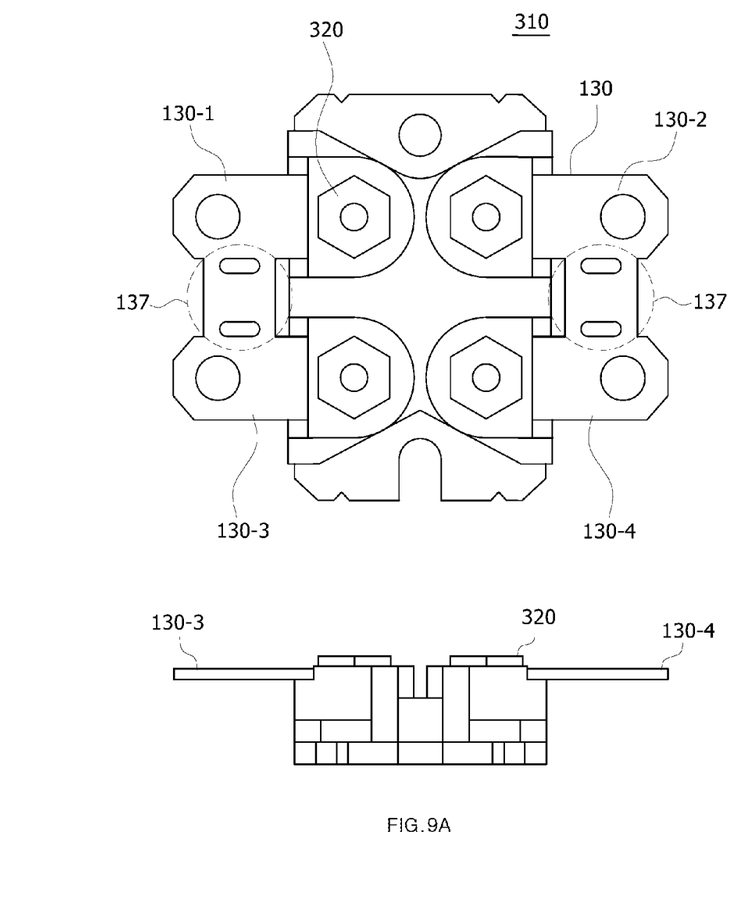
FIGS. 9A-9B are diagrams illustrating a relationship between a molding process and trimming and forming processes of a power semiconductor module according to an example.
Figure 9B:
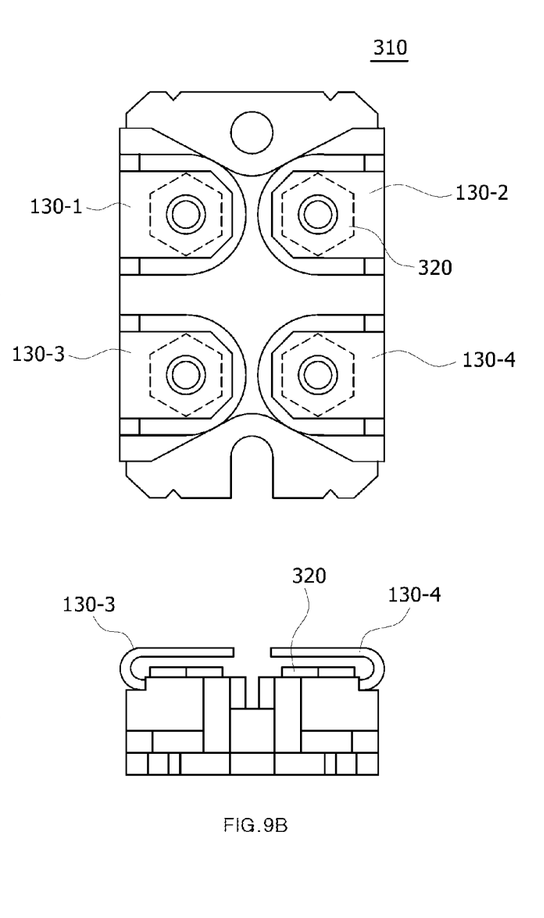

FIGS. 9A-9B are diagrams illustrating a molding process and trimming and forming processes of a power semiconductor module according to an example. FIG. 9A illustrates a molding process and illustrates a process of covering a semiconductor element and a plurality of terminals of a lead frame with plastic. A nut shape 320 to inject a bolt is formed through the process.

In the example of FIG. 9B, a trimming area 137 is removed and forming is performed. A forming process bends bodies 130-1 to 130-4 of the lead frame 130 by 180°. Therefore, the bodies 130-1 to 130-4 are aligned with the nut shape 320. In a subsequent process, assembly is performed using a bolt. In such a process, the bolt penetrates holes of the first body 130-1, the second body 130-2, the third body 130-3, and the fourth body 130-4. Therefore, the assembly package 310 including the power semiconductor module 100 is finally complete after these processes are finished.

Therefore, in a power semiconductor module according to an example, by implementing a lead frame by reducing the number of terminals, fault coupling is minimized upon producing a module.

In a method of manufacturing a power semiconductor module according to an example, after wire bonding of a semiconductor element, by discovering a defective product early by performing an early test, a time and cost in a module production process are prevented from being wasted.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A method of manufacturing a power semiconductor module, the method comprising:
preparing a Direct Bonded Copper (DBC) substrate comprising a metal pattern;
forming the power semiconductor module by wire bonding the metal pattern of the DBC substrate and an electrode of a power semiconductor element;
testing whether the power semiconductor module is defective;
coupling the DBC substrate to a base plate; and
coupling the DBC substrate and a lead frame,
wherein the lead frame comprises a first body connected to a first terminal, a second body connected to a second terminal, and third and fourth bodies connected to a third common terminal having a length larger than a length of the first terminal or the second terminal.

2. The method of claim 1, further comprising performing any one or any combination of any two or more of soldering, molding, trimming, marking, and a final test after the coupling of the DBC substrate and the lead frame.

3. A method of manufacturing a power semiconductor module, the method comprising:
preparing a Direct Bonded Copper (DBC) substrate comprising a metal pattern;
forming the power semiconductor module by wire bonding the metal pattern of the DBC substrate and an electrode of a power semiconductor element;
testing whether the power semiconductor module is defective;
coupling the DBC substrate to a base plate; and
coupling the DBC substrate and a lead frame,
wherein the metal pattern comprises a first metal pattern, a second metal pattern, and a third metal pattern separated from each other,
wherein the lead frame comprises a first terminal connected to a first body,
a second terminal connected to a second body, and
a third common terminal that connects a third body and a fourth body, and
wherein a length of the third common terminal is longer than a length of the first terminal or the second terminal.

4. The method of claim 1, wherein the first terminal is electrically connected to a drain electrode of the power semiconductor element on the DBC substrate, the second terminal is electrically connected to a gate electrode of the power semiconductor element, and the third common terminal is electrically connected to a source electrode of the power semiconductor element.

5. The method of claim 3, wherein the first terminal is connected to the first metal pattern, the second terminal is connected to the second metal pattern, and the third common terminal is connected to the third metal pattern.

6. The method of claim 1, wherein the DBC substrate comprises a first conductive layer, an insulating layer on the first conductive layer, and a second conductive layer on the insulating layer.

7. A method of manufacturing a power semiconductor module, the method comprising:
providing a substrate comprising a metal pattern;
performing a wire bonding to electrically connect the metal pattern to an electrode of a power semiconductor element to form the power semiconductor module; and
connecting a lead frame comprising a first body, a second body, a third body and a fourth body to the substrate, the substrate being a direct bonded copper (DBC) substrate disposed on a base plate,
wherein the first body is connected to a first terminal, and the second body is connected to a second terminal, and
wherein the third and fourth bodies are spaced apart from each other and respectively connected to a third common terminal having a length larger than a length of the first terminal or the second terminal.

8. The method of claim 7, wherein the metal pattern comprises first to third metal patterns separated from each other.

9. The method of claim 8, wherein the first terminal is connected to the first metal pattern, the second terminal is connected to the second metal pattern, and the third common terminal is connected to the third metal pattern.

10. The method of claim 7, further comprising removing a trimming area formed between the first and third bodies and between the second and fourth bodies of the lead frame so as to divide the lead frame into four separate bodies.

11. The method of claim 7, further comprising bending the respective first to fourth bodies of the lead frame to be aligned with the substrate.

12. The method of claim 8, wherein the third common terminal connected to the third and fourth bodies is formed on the third metal pattern.

13. The method of claim 12, wherein the third common terminal is not coplanar with the respective third and fourth bodies of the lead frame.

14. The method of claim 13, wherein the third common terminal is located below the third and fourth bodies.

* * * * *